United States Patent [19]
Ozaki

[11] Patent Number: 5,899,739
[45] Date of Patent: May 4, 1999

[54] SEMICONDUCTOR DEVICE AND METHOD OF MANUFACTURING THE SAME

[75] Inventor: Tohru Ozaki, Tokyo, Japan

[73] Assignee: Kabushiki Kaisha Toshiba, Kawasaki, Japan

[21] Appl. No.: 08/714,405

[22] Filed: Sep. 16, 1996

[30] Foreign Application Priority Data

Sep. 18, 1995 [JP] Japan .................................. 7-238847

[51] Int. Cl.⁶ .................................................. H01L 21/44
[52] U.S. Cl. .......................... 438/624; 438/637; 438/669
[58] Field of Search .................................. 438/624, 699, 438/723, 763, 637, 669, 631

[56] References Cited

U.S. PATENT DOCUMENTS

| | | |
|---|---|---|
| 5,200,358 | 4/1993 | Bollinger et al. . |
| 5,312,773 | 5/1994 | Nagashima . |
| 5,420,075 | 5/1995 | Homma et al. . |
| 5,432,381 | 7/1995 | Melzner . |
| 5,482,894 | 1/1996 | Havemann . |

FOREIGN PATENT DOCUMENTS

| | | |
|---|---|---|
| 44 26 311 | 2/1995 | Germany . |
| 62-156834 | 7/1987 | Japan . |

*Primary Examiner*—Caridad Everhart
*Attorney, Agent, or Firm*—Oblon, Spivak, McClelland, Maier & Neustadt, P.C.

[57] ABSTRACT

A method of manufacturing a semiconductor device. First, a plurality of wires are arranged in parallel to one another, on a semiconductor substrate. Then, insulating films of a first group are formed on tops of the wires, respectively. Next, second insulating films of a second group are formed on sides of the wires, respectively. Further, among the wires there are formed insulating films of a third group which have upper surfaces located at a level not higher than upper surfaces of the insulating films of the second group. Thereafter, contact holes are formed by subjecting the insulating films of the third group to selectively etching. Finally, the contact holes are filled with electrically conductive material.

16 Claims, 17 Drawing Sheets

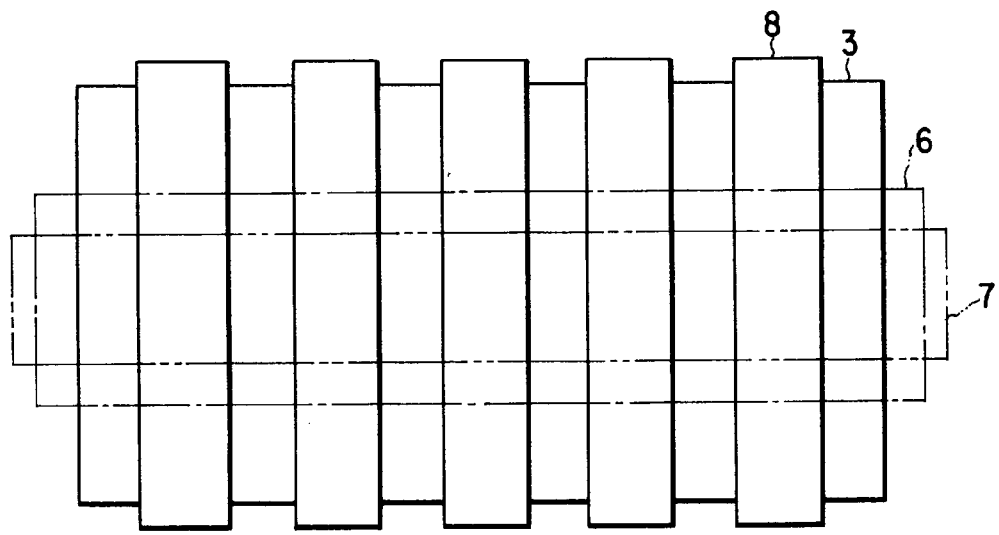
F I G. 3

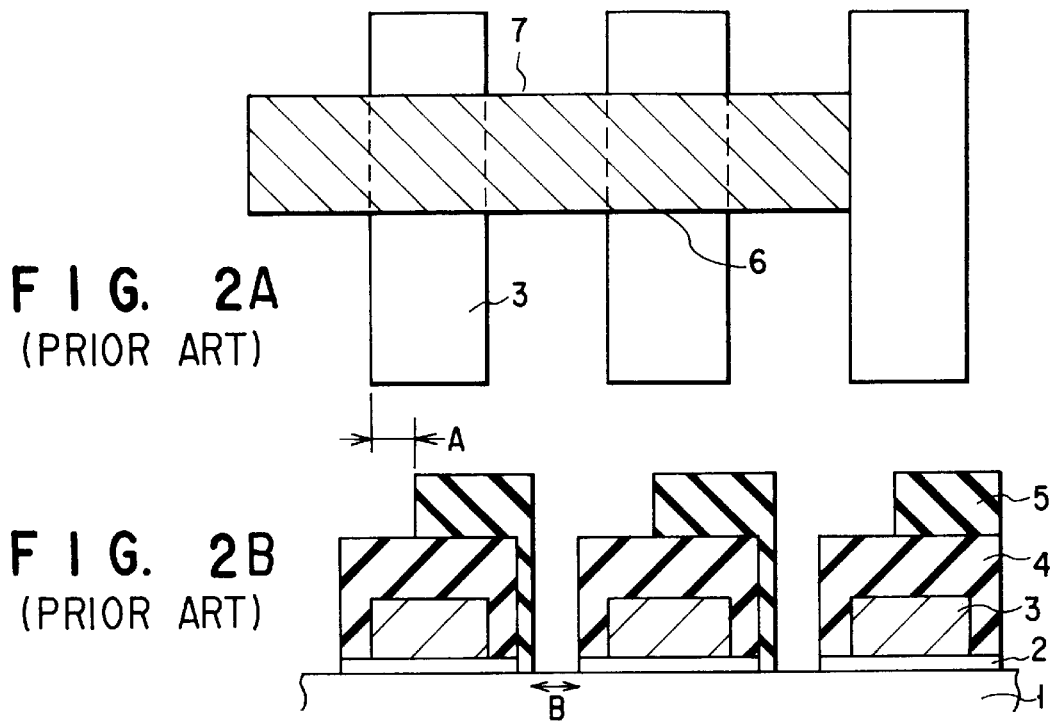
FIG. 2A (PRIOR ART)
FIG. 2B (PRIOR ART)
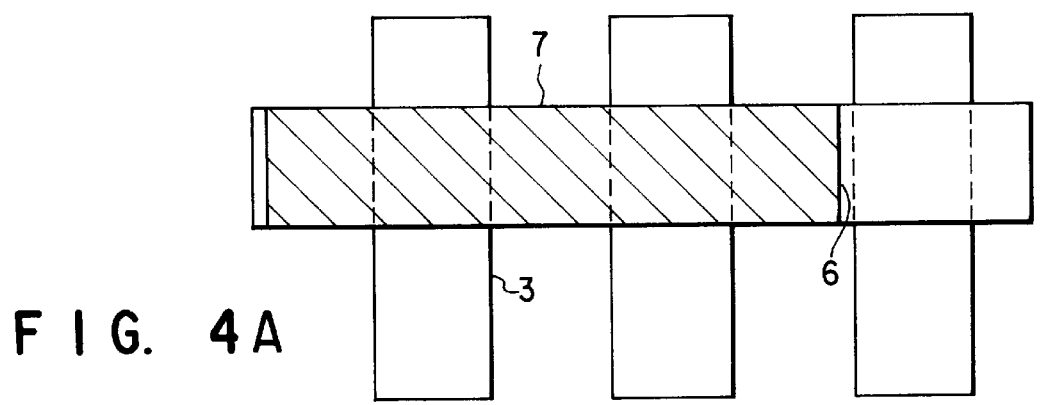
FIG. 4A
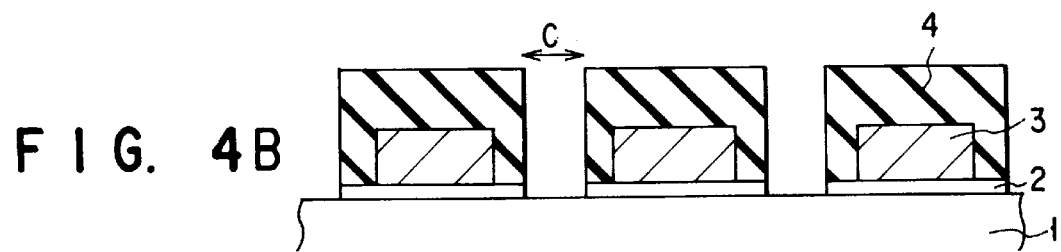
FIG. 4B

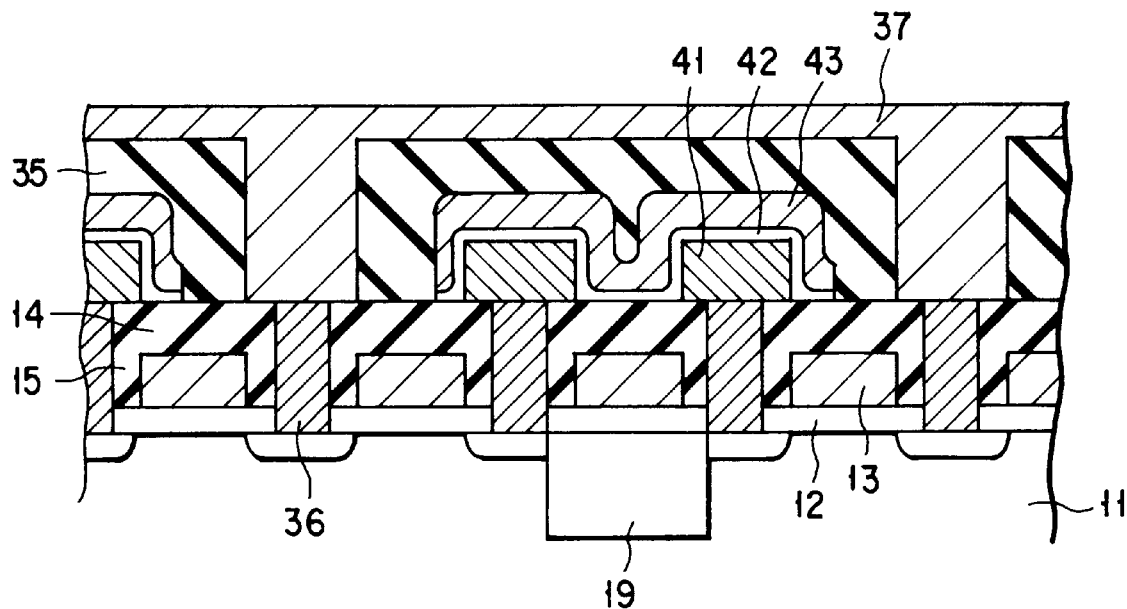
F I G. 10A
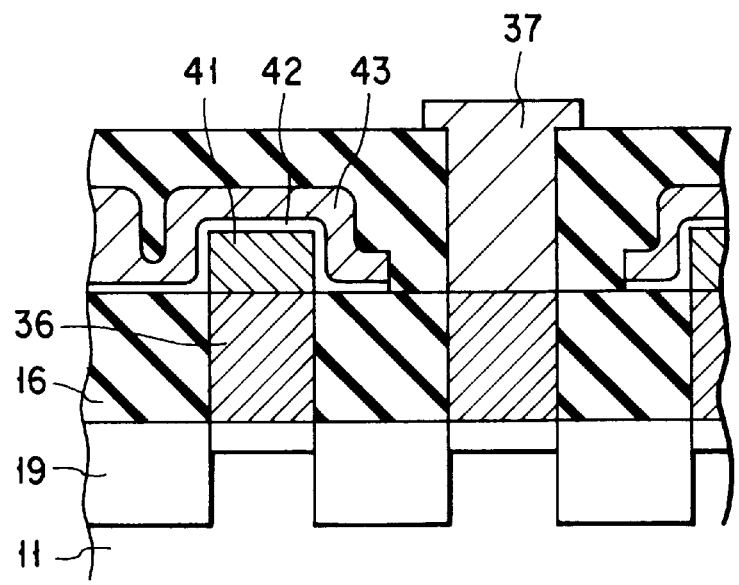
F I G. 10B

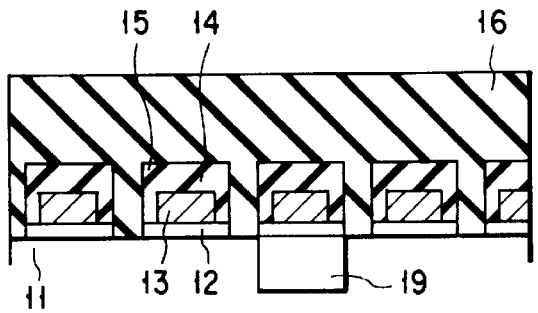
F I G. 11A
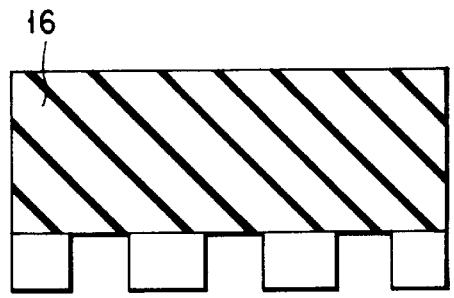
F I G. 11F
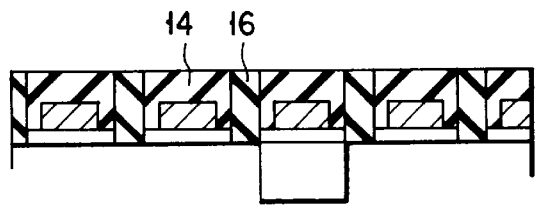
F I G. 11B
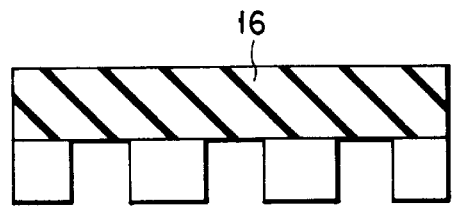
F I G. 11G
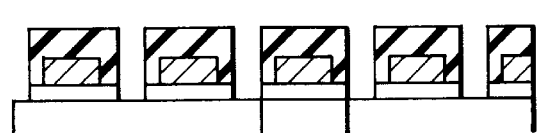
F I G. 11C
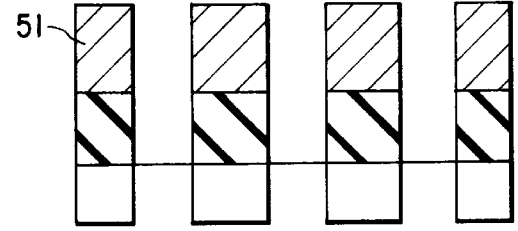
F I G. 11H
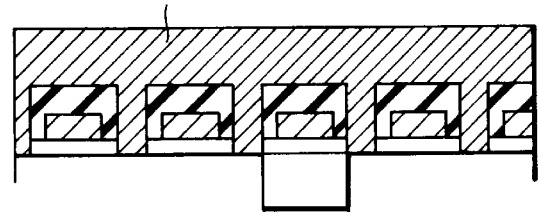
F I G. 11D
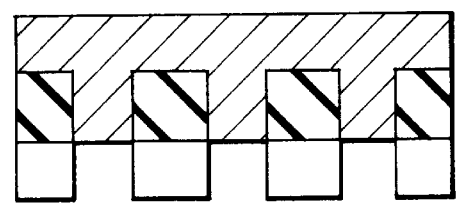
F I G. 11I
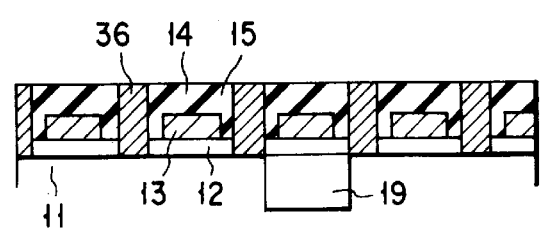
F I G. 11E
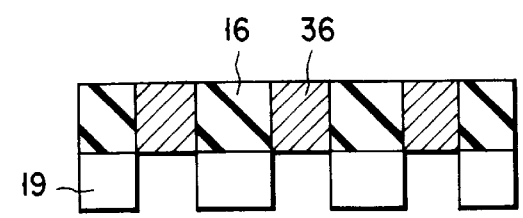
F I G. 11J

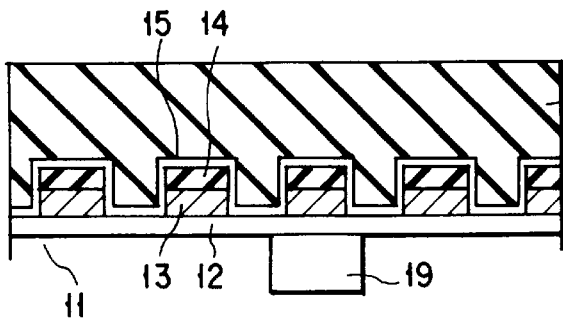
F I G. 14A
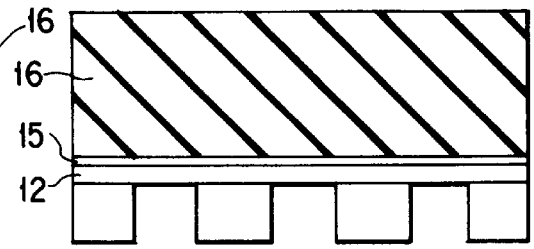
F I G. 14F
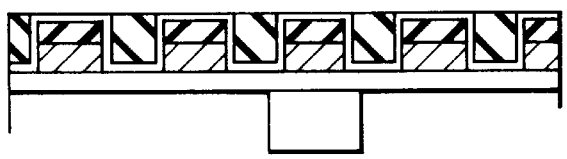
F I G. 14B
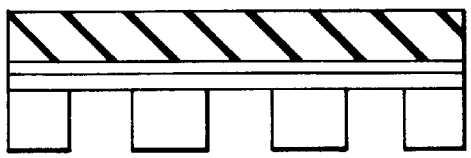
F I G. 14G
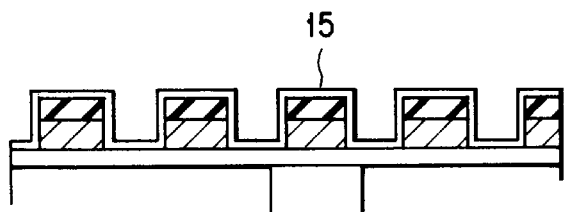
F I G. 14C
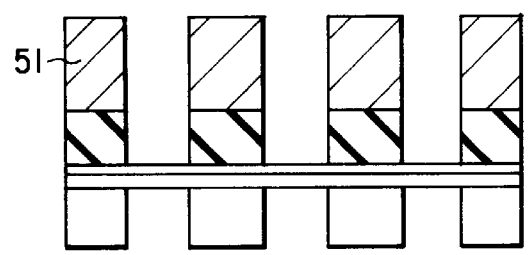
F I G. 14H
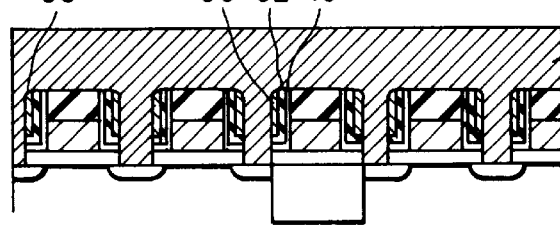
F I G. 14D
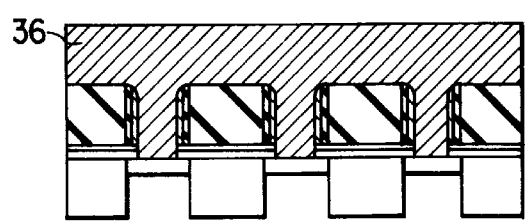
F I G. 14I
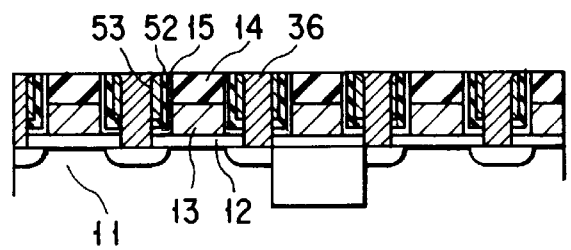
F I G. 14E
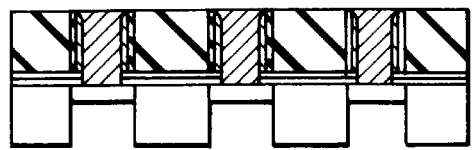
F I G. 14J

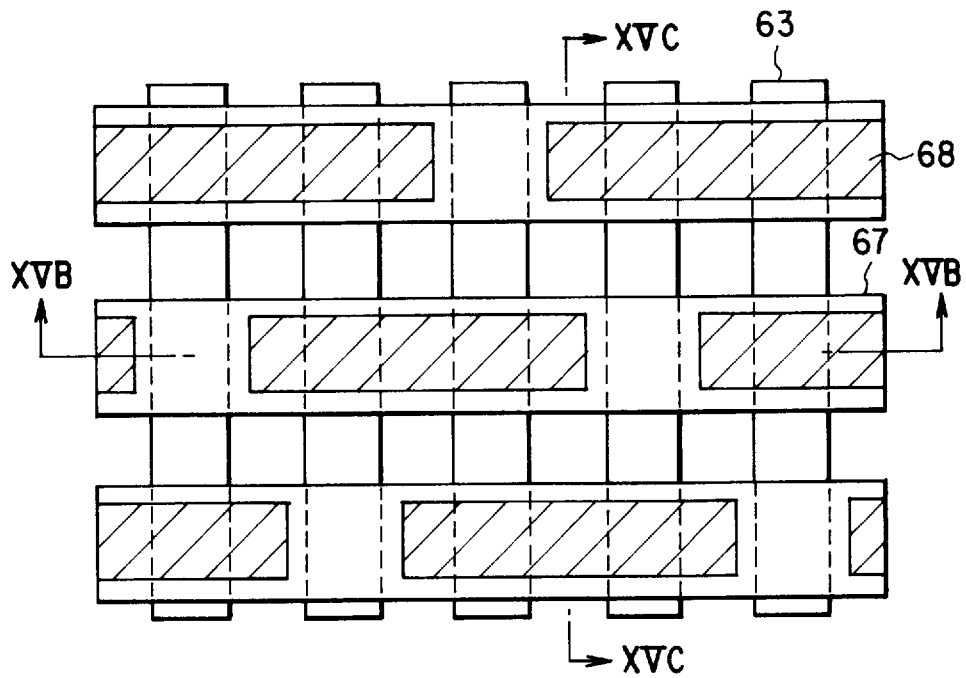
F I G. 15 A
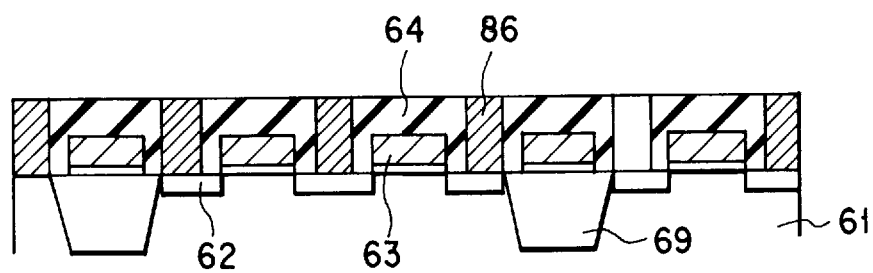
F I G. 15 B
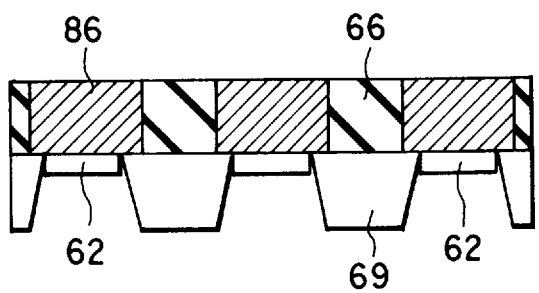
F I G. 15 C

5,899,739

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly to a semiconductor device, such as a semiconductor memory, which has a plurality of wires extending in parallel, and a method of manufacturing a semiconductor device of this type.

2. Description of the Related Art

In recent years, dynamic random-access memories (DRAMs) have had their integration density increased remarkably. There have been developed 16 M-bit DRAMs and 64 M-bit DRAMs. A DRAM having a storage capacity of 1 G bits, called "next-generation DRAM," is being developed now.

FIG. 1 is a plan view representing the layout pattern of a conventional DRAM or the like. As shown in FIG. 1, element regions 6 having source-drain contacts are arranged in parallel. Gate electrodes 3 are arranged to sandwich the element regions 6. Each of the gate electrodes 3 must be prevented from contacting with the contacts 7. For this reason, unnecessary spaces are created as shown in FIG. 1.

Meanwhile, a storage-node contact and a bit-line contact of a 16 M-bit DRAM or a 64 M-bit DRAM are formed using a hole pattern corresponding to one contact. If contacts of this type are formed in a 1 G-bit DRAM, each contact hole will have an insufficiently small area, because of the displacement of a contact-hole pattern with respect to the gate electrodes. As a consequence, contact failure may take place, as will be explained with reference to FIGS. 2A and 2B.

FIG. 2A and FIG. 2B are a plan view and a cross sectional view of a semiconductor device. As shown in FIGS. 2A and 2B, the device comprises a semiconductor substrate 1, a gate-insulating film 2, gate electrodes (wires) 3, a gate-protecting film 4, an inter-layer insulating film 5, an element region 6, and a contact 7. The inter-layer insulating film 5 is displaced with respect to the gate electrode 3 by the distance A. The contact holes inevitably have their area reduced to a value B which is less than the designed value.

As mentioned above, the greater the storage capacity of a DRAM, the less the area of each contact hole because of the displacement of the contact-hole pattern with respect to the gate electrodes. Consequently, contact failure will occur. This problem arises not only a DRAM, but also in semiconductor devices in which contact holes are provided among wires extending in parallel.

SUMMARY OF THE INVENTION

An object of the present invention is to provide a semiconductor device in which no contact failure occurs even if contact holes are displaced with respect to wires extending parallel, and also to a method of manufacturing the semiconductor device.

According to a first aspect of the present invention, there is provided a method of manufacturing a semiconductor device, comprising the steps of arranging a plurality of wires, on a semiconductor substrate; forming insulating films of a first group on tops of the wires, respectively; forming insulating films of a second group on sides of the wires, respectively; forming, among the wires, insulating films of a third group which have upper surfaces located at a level not higher than upper surfaces of the insulating films of the first group; forming contact holes by subjecting the insulating films of the third group to selectively etching; and filling the contact holes with electrically conductive material.

According to a second aspect of the present invention, there is provided a method of manufacturing a semiconductor device, comprising the steps of arranging a plurality of wires, on a semiconductor substrate; forming insulating films of a first group on tops of the wires, respectively; forming insulating films of a second group on sides of the wires, respectively; forming insulating films of a third group among the wires; forming contact holes by subjecting the insulating films of the third group to selectively etching; and filling the contact holes with electrically conductive material, thereby forming contacts which have upper surfaces located at a level not higher than upper surfaces of remaining parts of the insulating films of the first group.

In each of the methods described above, the step of forming the contact holes may include a step of forming a pattern having slits which intersect with at least one of the wires. In this case, it is desirable that the step of forming the pattern includes a step of etching the insulating films of the third group by using a mask having slits and by using the insulating film of the first group as a stopper. Otherwise, it is desirable that the step of forming the pattern includes a step of etching the insulating films of the third group by using a mask having slits and by using the insulating films of the first and second groups as a stopper. The method may further comprise the step of forming insulating films of fourth group on sides of the contact holes after the step of forming the contact holes. Alternatively, the method may further comprise the step of forming two-layer films on sides of the contact holes after the step of forming the contact holes, each of the two-layer films including an insulating film and a conductive film.

In the above methods, the plurality of wires may be arranged in parallel to one another.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 1 is a plan view representing the layout pattern of a conventional DRAM or the like;

FIGS. 2A and 2B are a plan view and a sectional view of a conventional DRAM, showing the displacement of the contact holes with respect to the gate electrodes;

FIG. 3 is a plan view representing the layout pattern of a DRAM or the like according to the present invention;

FIGS. 4A and 4B are a plan view and a sectional view of a semiconductor device according to the present invention, illustrating the displacement of the contact holes with respect to the gate electrodes;

FIGS. 10A and 10B are sectional views, taken along line XA—XA and line XB—XB in FIG. 9, respectively;

FIGS. 11A to 11J are sectional views explaining a method of manufacturing a DRAM according to a fourth embodiment of the present invention;

FIGS. 14A to 14J are sectional views explaining a method of manufacturing a DRAM according to a seventh embodiment of the present invention;

FIGS. 15A to 15C are sectional views explaining a method of manufacturing a DRAM according to an eighth embodiment of the present invention;

DETAILED DESCRIPTION OF THE PREFERRED EMBODIMENTS

Figure 1:
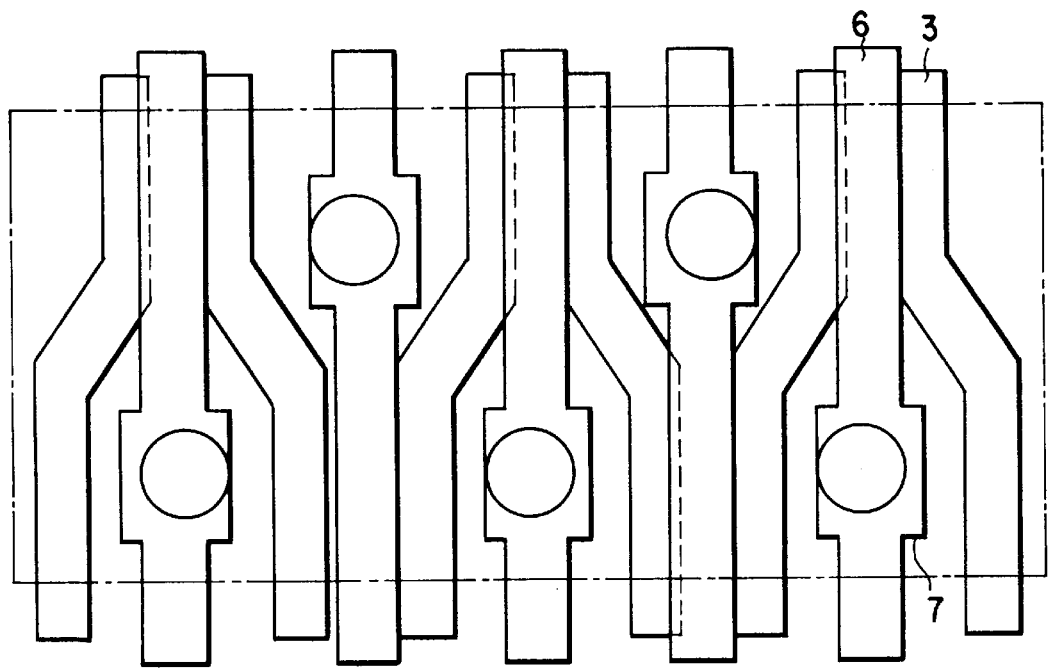

The basic concept of the present invention will be briefly described before the embodiments of the present invention, to facilitate the understanding of the present invention.

FIG. 3 is a plan view representing the layout pattern, e.g., the layout pattern of the wires (the gate wires or the like) in a peripheral circuitry section or the cell layout pattern of a DRAM according to the present invention.

Let us apply the present invention to, for example, a DRAM. As shown in FIG. 3, gate electrodes 3 are arranged in parallel, and each wiring pattern 8 is formed between the gate electrodes 3. On the other hand, element region 6 is arranged to extend at a right angle to the gate electrodes 3. A contact 7 is selectively formed in the element region 6.

As is obvious from FIG. 3, a layout of the DRAM according to the present invention is different from that of the conventional DRAM. That is, according to the present invention, unnecessary space is not created, and further, no contact failure occurs even if contact holes are displaced with respect to wires extending parallel.

The DRAM is manufactured by the method described below.

First, insulating films of a first group are formed on the tops of gate electrodes, and insulating films of a second group are formed on the sides of the gate electrodes. Then, insulating films of a third group, i.e., inter-layer insulating films, are formed among the gate electrodes. The insulating films of the third group have their upper surfaces at the same level as the upper surfaces of the insulating films of the first group or at a lower level. Thus, any two adjacent conductive materials filled in contact holes, which oppose across an insulating film of the first group, are not short-circuited with each other.

Thereafter, the insulating films of the third group are etched, using the insulating films of the first and second groups, which have a lower etching rate than the insulating films of the third group. The insulating films of the first and second groups constitute a stopper which has slits extending parallel to the bit lines. The remaining part of each insulating film of the third group is shaped like a bridge and located between two adjacent gate electrodes. Each contact is formed in a space surrounded by the insulating films of the second group and the insulating films of the third group.

Then, the contact holes are filled with conductive material, forming a contact in each contact hole. Each contact thus formed has an upper surface located at a level not higher than that of the insulating films of the third group. Thus, any two adjacent conductive materials filled in contact holes, which oppose across one insulating film of the third group, are not shortcircuited with each other.

The insulating films of the third group, formed on the gate electrodes, may be etched back so that they may be flush at their upper surfaces with the insulating films of the first group. In this case, there will be formed no stepped portions at the insulating films of the third group.

As indicated above, the pattern for forming contacts has continuous slits which extend parallel to the bit lines (i.e., slit pattern), and the insulating films of the first and second group are used as the stopper. The contact holes can be formed in self-alignment as is shown in FIGS. 4A and 4B. Therefore, no contact failure will occur even if the displacement in the direction of bit lines occurs to an extent equivalent to a design rule. Unlike in the conventional semiconductor device shown in FIGS. 2A and 2B, the contact holes C have the same size though they are displaced along the bit lines. This is because the contacts 7 are arranged in parallel to the bit lines.

Side walls, or additional insulating films, may be formed by RIE (Reactive Ion Etching) to reinforce the insulating films of the second group formed on the sides of the gate electrodes. The side walls increase the insulating between the gate electrodes on the one hand and the contacts on the other hand. Formed by RIE, the side walls may become thinner than desired. To prevent the reduction of thickness, additional side walls which are conductive films (e.g., polysilicon films) may be formed at the same time the side walls are formed. In this case, the gate-contact insulation is much more enhanced.

Embodiments of the present invention will be described in detail, with reference to the accompanying drawings.

First Embodiment

Figure 5:
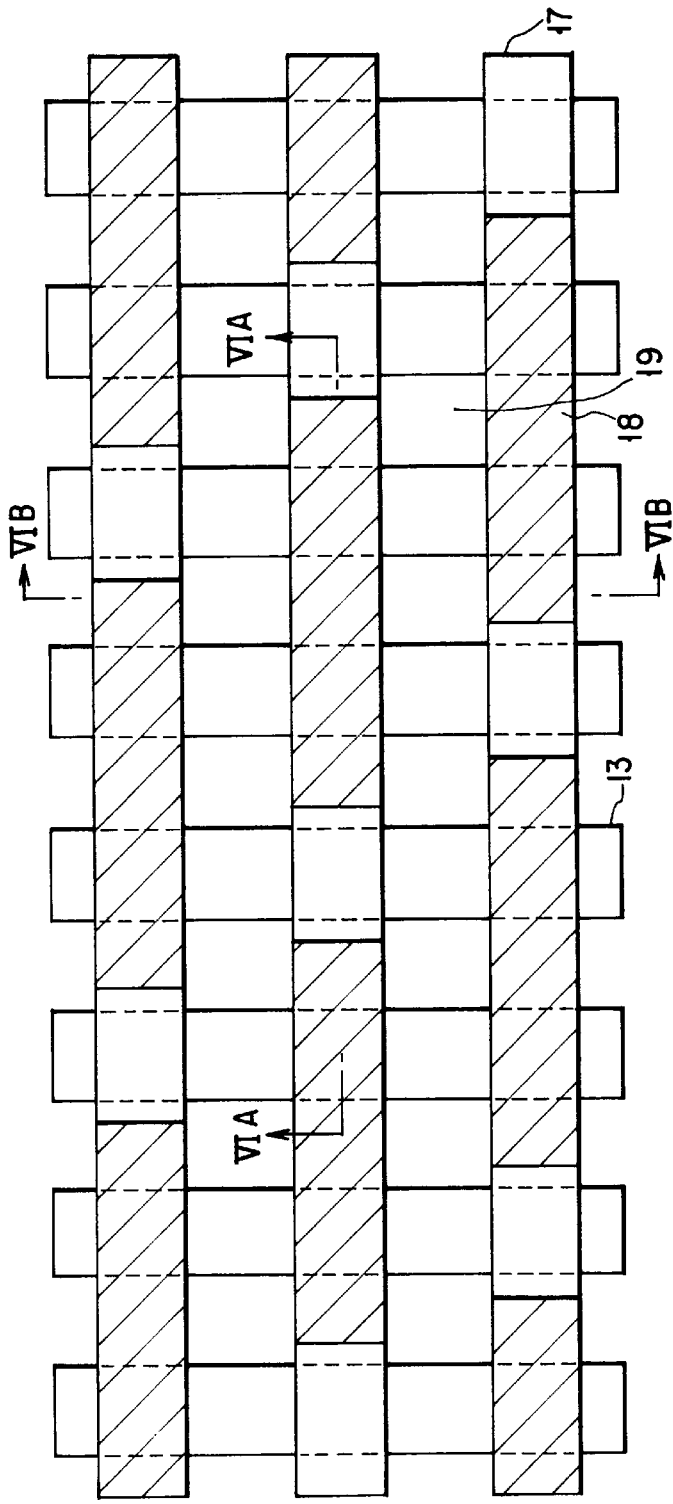
FIG. 5 is a plan view representing the layout pattern of a DRAM according to a first embodiment of the present invention.
Figure 6B:
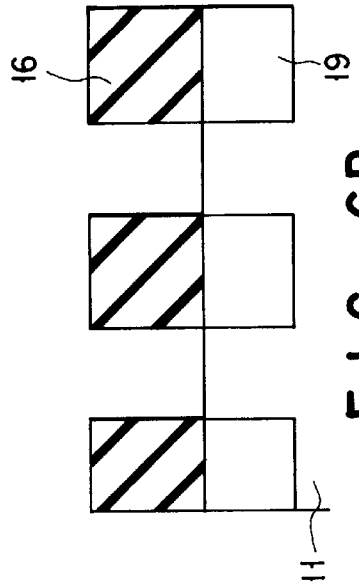
FIGS. 6A and 6B are sectional views, taken along line VIA—VIA and line VIB—VIB in FIG. 5, respectively.
Figure 6A:
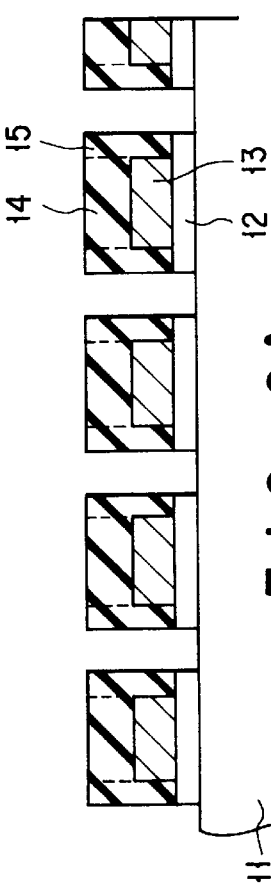

FIG. 5 is a plan view representing the layout pattern of a DRAM according to the first embodiment of the present invention. FIGS. 6A and 6B are sectional views, taken along line VIA—VIA and line VIB—VIB in FIG. 5, respectively.

As shown in FIG. 6A, the DRAM comprises a semiconductor substrate 11, gate-insulating films 12 provided on the substrate 11, and gate electrodes 13 provided on the films 12. The gate electrodes 13 function as word lines and extend parallel to one another. Insulating films 14 (e.g., silicon nitride films) of a first group are provided on the tops of the gate electrodes 13, and insulating films 15 (e.g., silicon nitride films) of a second group are provided on the sides of the gate electrodes 13. As shown in FIG. 6B, insulating films 16 (e.g., silicon dioxide films) of a third group are provided among the gate electrodes 13. As shown in FIG. 5, a contact-forming mask 17 has slits which extend at right angles to the gate electrode 13. The insulating films 16 have been formed by performing selectively etching on an insulating film, using the insulating films 14 and 15 as etching stoppers, thereby forming contact holes.

Two opposite sides of each contact hole which are spaced apart along the gate electrodes 13 are defined by the contact-forming mask 17, whereas the other opposite sides which are spaced apart along a line intersecting with the gate electrodes 13 at right angles are defined by the insulating films 14 and 15. Since the insulating films 14 and 15 are self-aligned with the gate electrodes 13, the contact holes are self-aligned with the gate electrodes 13, along lines extending at right angles to the gate electrodes 13.

As shown in FIG. 5, the DRAM has element regions 18 (shaded) and element-isolating regions 19.

The memory cells of this DRAM are arranged in $6F^2$ open-folded scheme (F: minimum-processing size), which is disclosed in D. Takahashi et al., *VLSI Circuit*, 1993, p. 89. In this memory layout-scheme, only one passing word line is provided between the memory cells which are adjacent along the bit lines. Since each contact hole is formed using the patterns which extend at right angles to the word lines, the contact hole provided in it is divided into two parts for a bit-line contact portion and a storage-node contact portion, respectively. The contact holes would not be formed at unnecessary portions.

Second Embodiment

Figure 7:
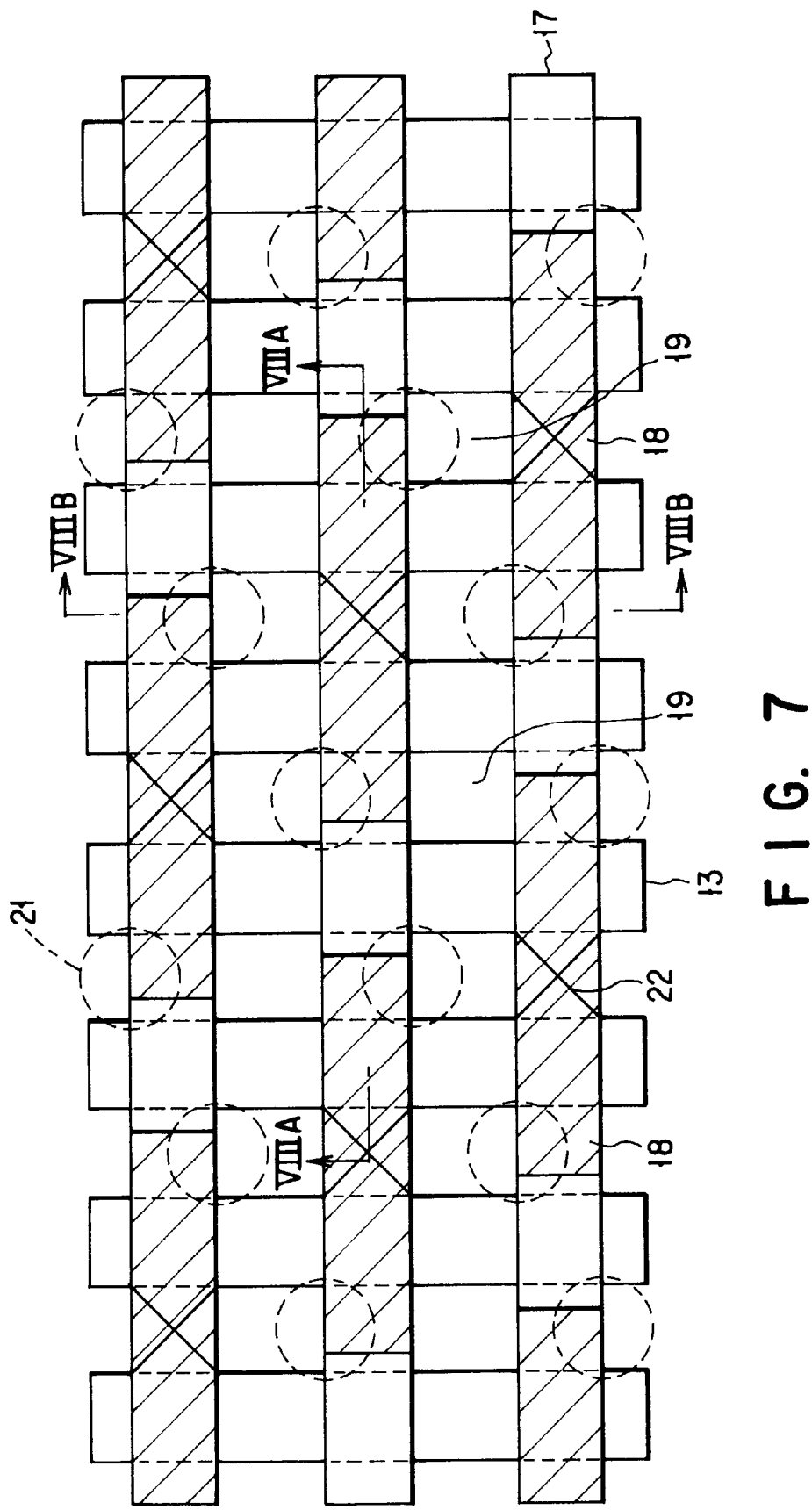
FIG. 7 is a plan view representing the layout pattern of a DRAM according to a second embodiment of the present invention.
Figure 8A:
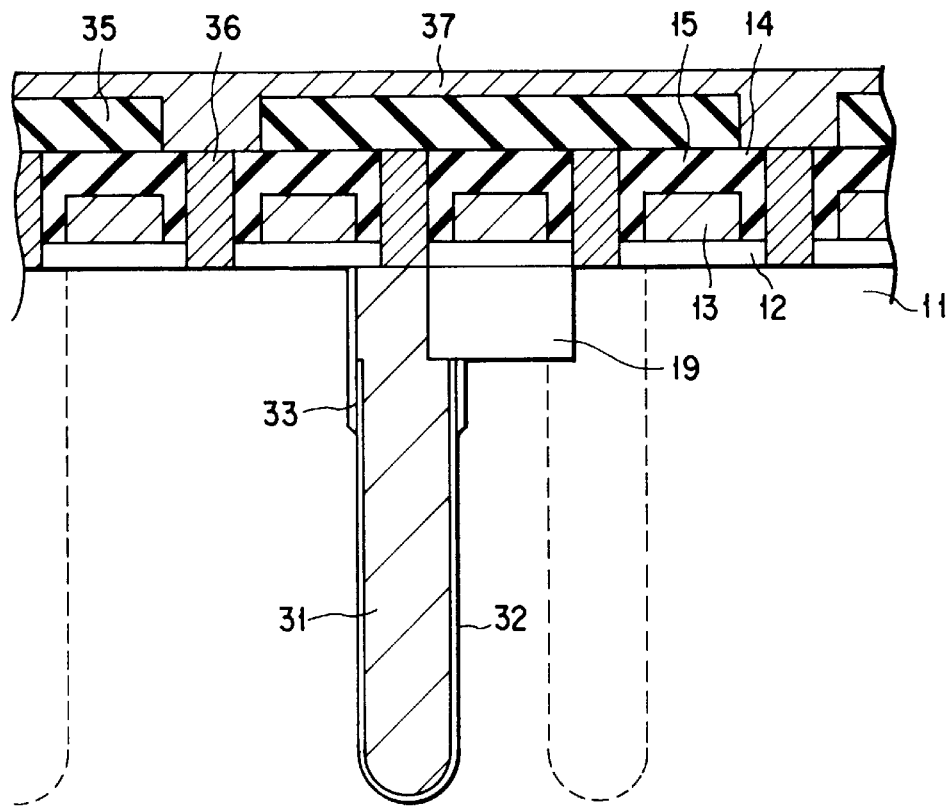
FIGS. 8A and 8B are sectional views, taken along line VIIIA—VIIIA and line VIIIB—VIIIB in FIG. 7, respectively.
Figure 8B:
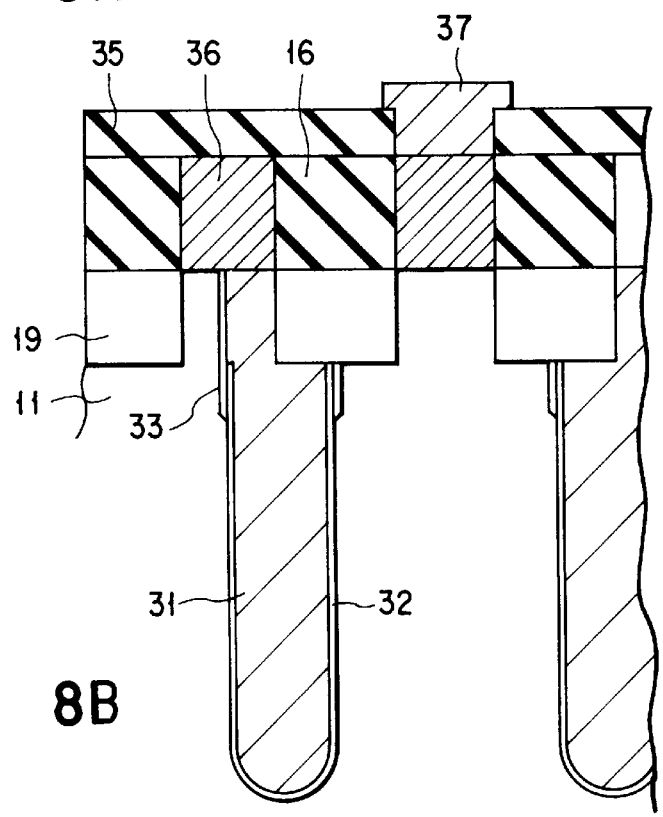

FIG. 7 is a plan view representing the layout pattern of a DRAM according to the second embodiment of the present invention. FIGS. 8A and 8B are sectional views, taken along line VIIIA—VIIIA and line VIIIB—VIIIB in FIG. 7, respectively. The components similar or identical to those shown in FIGS. 5, 6A and 6B are designated with the same numerals in FIGS. 7, 8A and 8B and will not be described in detail.

As shown in FIG. 7, the second embodiment has trenches 21 (circles) and bit-line contacts 22 (crosses). As seen from FIGS. 8A and 8B, it has storage electrodes 31, capacitor-insulating films 32, collar oxide films 33, inter-layer insulating films 35, buried electrodes 36 and bit lines 37.

As shown in FIG. 7, the memory cells are arranged in open-folded scheme as in the first embodiment. Two SN contacts and one bit-line contact 22 are provided in each element region (shaded) 18. Each trench 21 overlaps the element region 18, for a distance equal to about half the minimum-processing size F. Provided in the trench 21 is one storage electrode 31. The electrode 31 can be connected on the surface of the substrate to that part of the element region 18 which does not overlap the trench 21.

As can be understood from FIGS. 8A and 8B, the contact hole made in each bit-line contact portion and each storage-node contact portion are filled with electrode material (e.g., polycrystalline silicon), forming an electrode 36. The electrode 36 connects the storage electrode 31 to the element region 18.

The electrode 36 which is formed in the region of the bit-line contact results in sufficient higher contact. Therefore, appropriate contacts are attained without performing again deep etching to form bit lines in case of opening the bit-line contacts.

Third Embodiment

Figure 9:
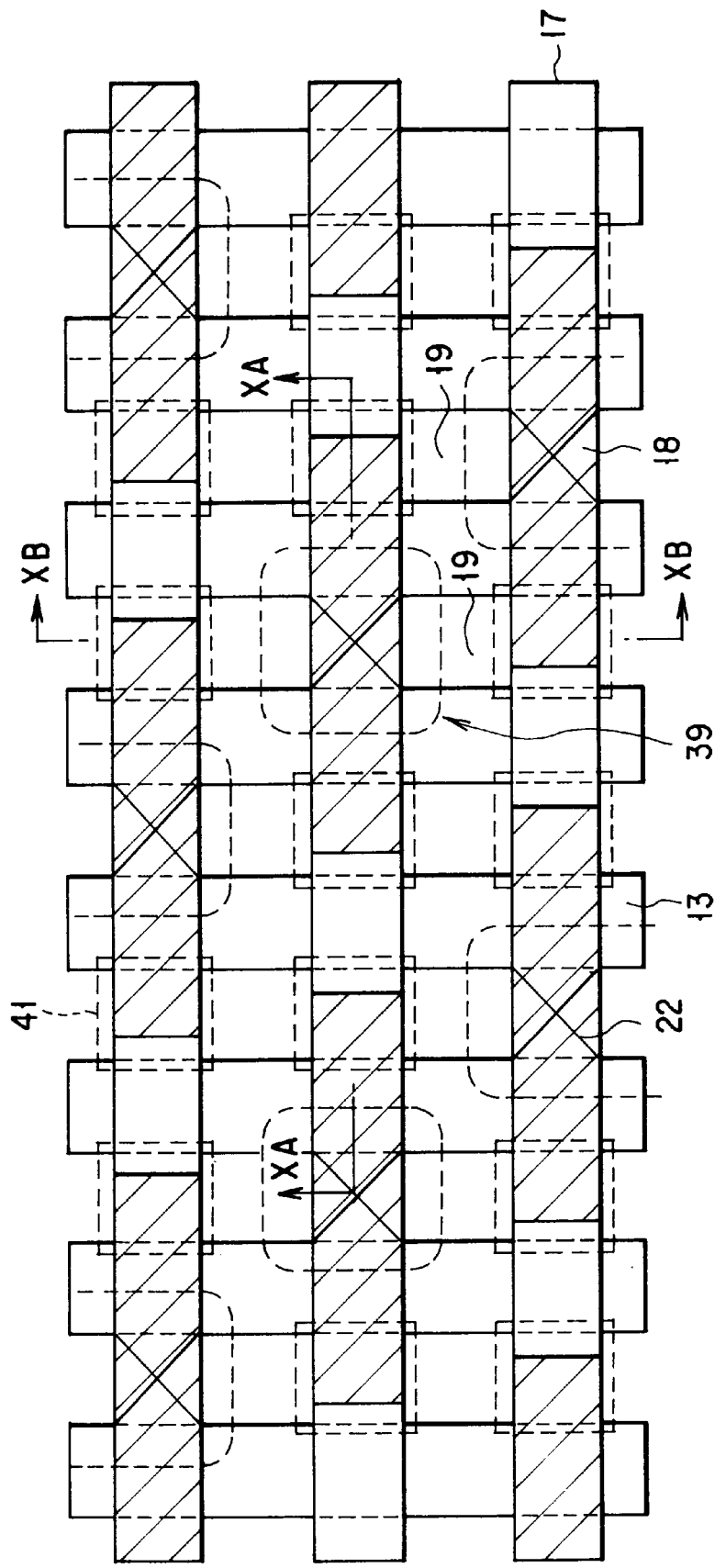
FIG. 9 is a plan view representing the layout pattern of a DRAM according to a third embodiment of the present invention.

FIG. 9 is a plan view representing the layout pattern of a DRAM according to the third embodiment of the present invention. FIGS. 10A and 10B are sectional views, taken along line XA—XA and line XB—XB in FIG. 9, respectively;

The third embodiment is basically similar to the first embodiment; it is a stacked DRAM. As shown in FIG. 9, the memory cells are arranged in the same way as in the trench-type DRAM. Storage electrodes 41 are provided on the storage-node contact portions, and window patterns 39 on the bit-line contact portions. The patterns 39 are provided, each for removing a part of a plate electrode which will be the counter electrode of a capacitor.

As shown in FIGS. 10A and 10B, electrode material (e.g., polycrystalline silicon) is filled in the contact holes made in the bit-line contact portions and storage-node contact portions, forming electrodes 36.

Provided on the electrodes 36 are accumulation electrodes 41. Capacitor-insulating films 42 are provided on the storage electrodes 41. Plate electrodes 43 are provided on the capacitor-insulating films 42, respectively. The bit-line contact portions of the plate electrodes 42 are removed in part by using the window patterns 39. Bit lines 37 are connected to the electrode 36 which are located below bit-line contacts 22.

Fourth Embodiment

The fourth embodiment of the present invention is a DRAM similar to the second embodiment illustrated in FIGS. 5, 6A and 6B. A method of manufacturing the fourth embodiment will be explained, with reference to FIGS. 11A to 11J. FIGS. 11A to 11E correspond to FIG. 6A, and FIGS. 11F to 11J to FIG. 6B.

First, as shown in FIGS. 11A and 11F, gate-insulating films 12 are formed on a semiconductor substrate 11 and gate electrodes 13 are formed on the insulating films 12. Further, insulating films 14 of a first group are formed on the tops of the gate electrodes 13, and insulating films 15 of a second group on the sides of the gate electrodes 13. (The insulating films 14 and 15 are made of, for example, silicon nitride.) Then, an insulating film 16 is deposited on the entire surface of the structure, filling the gaps among the gate electrodes 13 and covering the insulating films 14 and 15. The insulating film 16 is made of material different from the material of the insulating films 14 and 15. (For example, the film 16 is made of BPSG, PSG or $SiO_2$.)

Next, as shown in FIGS. 11B and 11G, the insulating film 16 is etched back (by means of, for example, polishing), whereby the upper surface of the film 16 is made almost flush with the upper surface of the insulating film 14 provided on each gate electrode 13. As a result, there are formed insulating films 16 of a third group which are located are among the gate electrodes 13 and the insulating films 15. It does not matter if the upper surface of the film 16 is higher or lower than that of each insulating film 14 by about 10% of the largest thickness of the gate electrode 13.

As shown in FIGS. 11C and 11H, the insulating films 16 of the third group are removed by RIE, using a resist pattern 51 having slits. Contact holes are thereby made. Then, as shown in FIGS. 11D and 11I, a conductive film 36 (e.g., polycrystalline silicon) is deposited, filling the contact holes and covering the insulating films 14 and 15.

Thereafter, as shown in FIGS. 11E and 11J, the conductive film 36 is etched back (by means of, for example, polishing, CDE or RIE), thereby forming electrodes 36 in the contact holes. A DRAM is thus manufactured which is similar in structure to the second embodiment shown in FIGS. 5, 6A and 6B.

As indicated above, the insulating films 14 and 15 are made of one material, and the insulating films 16 are made of another material. Therefore, the contact holes made through removing the insulating films 16 by etching can be self-aligned.

Fifth Embodiment

The fifth embodiment of the present invention is a DRAM similar to the second embodiment illustrated in FIGS. 5, 6A and 6B. A method of manufacturing the fifth embodiment will be explained, with reference to FIGS. 12A to 12J. FIGS. 12A to 12E correspond to FIG. 6A, and FIGS. 12F to 12J to FIG. 6B.

Figure 12A:
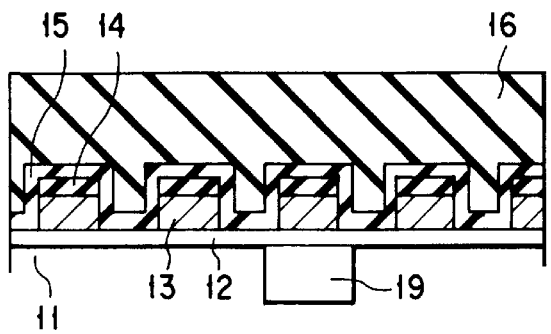
FIGS. 12A to 12J are sectional views explaining a method of manufacturing a DRAM according to a fifth embodiment of the present invention.
Figure 12F:
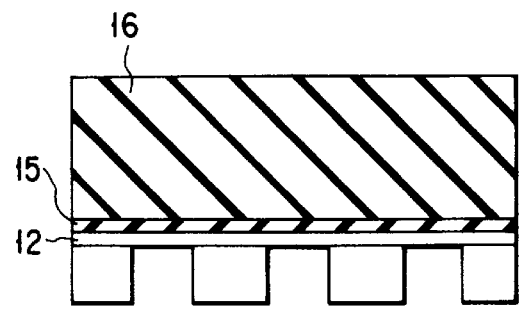

First, as shown in FIGS. 12A and 12F, a gate-insulating film 12 is formed on a semiconductor substrate 11, Then, gate electrodes 13 are formed on the insulating film 12. Further, insulating films 14 of a first group are formed on the tops of the gate electrodes 13. An insulating film 15 is formed, covering the insulating film 12, the gate electrodes 13 and the insulating films 14. Then, an insulating film 16 is deposited on the entire surface of the structure, covering the insulating film 15. The insulating films 14 and the insulating film 15 are made of, for example, silicon nitride. The insulating film 16 is made of material different from the material of the insulating films 14 and 15; for example, it is made of BPSG, PSG or $SiO_2$.

Figure 12B:
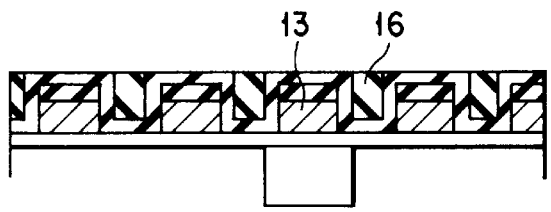
Figure 12G:
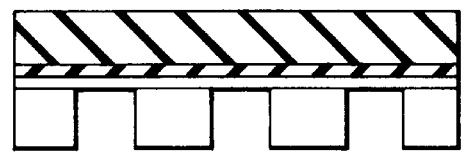
Figure 12C:
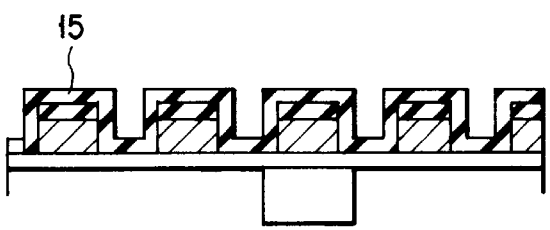
Figure 12H:
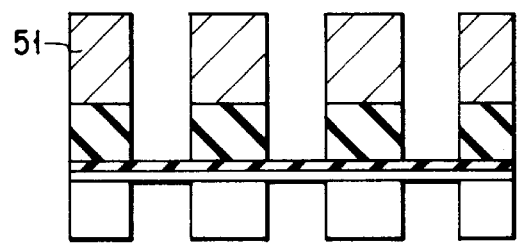
Figure 12D:
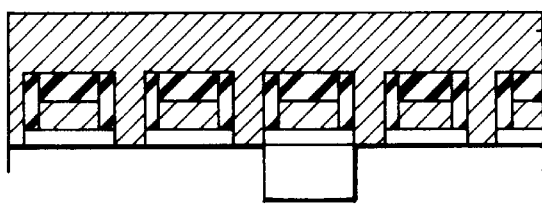
Figure 12I:
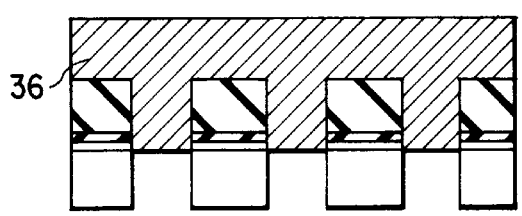
Figure 12E:
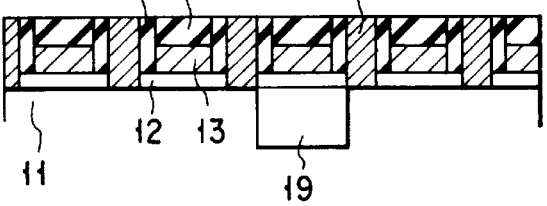
Figure 12J:
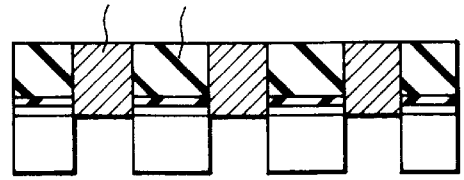

Thereafter, steps substantially the same as those of manufacturing the fourth embodiment are carried out. More specifically, as shown in FIGS. 12B and 12G, the insulating film 16 is etched back (by means of, for example, polishing), whereby the upper surface of the film 16 is made almost flush with the upper surface of the insulating film 14 provided on each gate electrode 13. As a result, there are formed insulating films 16 of a third group which are located among the gate electrodes 13 and the insulating films 15. Next, as shown in FIGS. 12C and 12H, the insulating films 16 of the third group are removed by RIE, using a resist pattern 51 having slits. The etching is stopped by using the insulating films 15. Then, as shown in FIGS. 12D and 12I, the insulating films 15 are subjected to RIE, thereby exposing the substrate 11, and a conductive film 36 is deposited. Thereafter, as shown in FIGS. 12E and 12J, the conductive film 36 is etched back.

In this method, the insulating films 15 stop the etching of the insulating films 16 of the third group. The over-etching of the substrate 11 is therefore less than in the fourth embodiment, preventing a reduction in the thickness of the substrate 11.

Sixth Embodiment

A method of manufacturing the sixth embodiment, which is an RAM, will be explained with reference to FIGS. 13A to 13J which are sectional views.

Figure 13A:
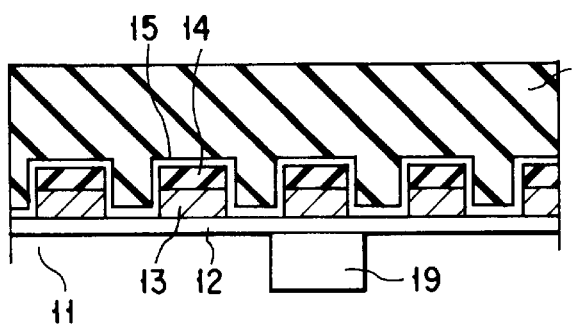
FIGS. 13A to 13J are sectional views explaining a method of manufacturing a DRAM according to a sixth embodiment of the present invention.
Figure 13F:
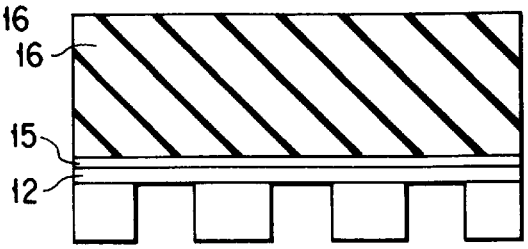
Figure 13B:
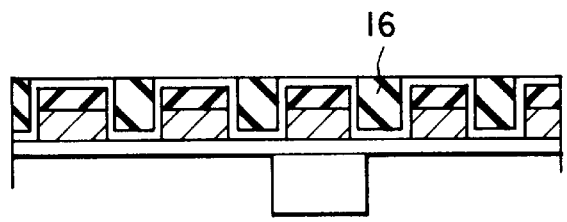
Figure 13G:
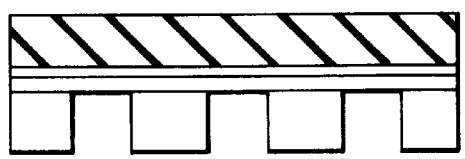
Figure 13C:
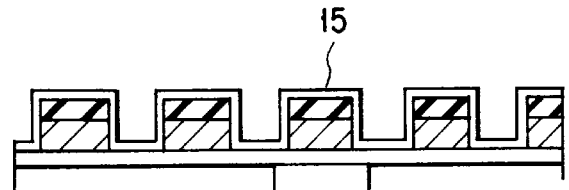
Figure 13H:
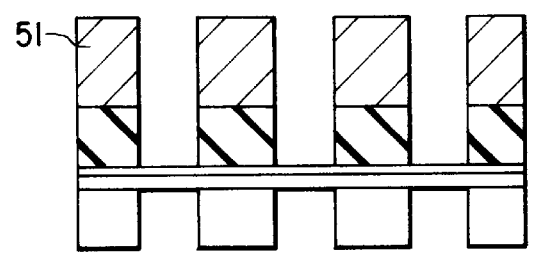

First, as shown in FIGS. 13A and 13F, a gate-insulating film 12, gate electrodes 13, insulating films 14 of a first group, an insulating film 15 and an insulating film 16 are formed in the same way as in the fifth embodiment and as illustrated in FIGS. 12A and 12F, except that the insulating film 15 is formed less thick, being 10 to 20 nm. Note that it is possible to omit the formation of the insulating film 15 as needed. Then, as shown in FIGS. 13B and 13G, an insulating film 16 of the third group is etched back, forming insulating films 16 of the third group, in the same way as in the fifth embodiment and as shown in FIGS. 12B and 12G. Next, as shown in FIGS. 13C and 13H, the insulating films 16 are removed by RIE, in the same manner as in the fifth embodiment and as illustrated in FIGS. 12C and 12H.

Figure 13D:
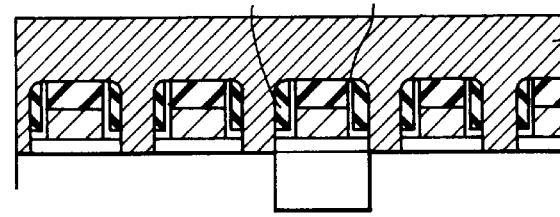
Figure 13I:
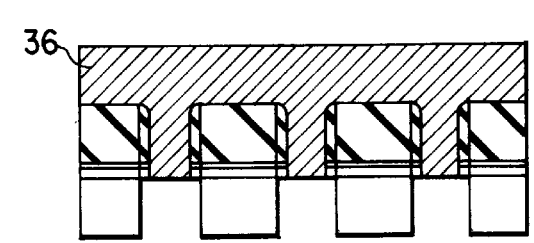
Figure 13E:
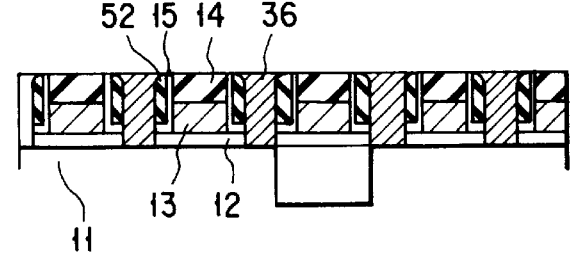
Figure 13J:
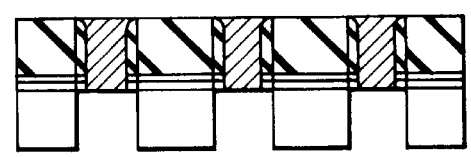

Thereafter, as shown in FIGS. 13D and 13I, side wall, or insulating films 52 of the fourth group, are formed in contact holes by means of RIE, and the substrate 11 is exposed at the same time. Further, a conductive film 36 is deposited. Thereafter, as shown in FIGS. 13E and 13J, the conductive film 36 is etched back, filling the contact holes.

In the sixth embodiment, the side walls are formed after the contact holes are made and can, therefore, be over-etched within a shorter time than in the fourth embodiment (FIGS. 11A to 11J) and the fifth embodiment (FIGS. 12A to 12J). Hence, the thickness of each side wall is reduced less, ensuring the insulation between the contact electrodes.

Seventh Embodiment

A method of manufacturing the seventh embodiment, which is also a RAM, will be explained with reference to FIGS. 14A to 14J. The steps shown in FIGS. 14A to 14C are identical to the steps of manufacturing the sixth embodiment, illustrated in FIG. 13A to 13C, and the steps shown in FIGS. 14F to 14H are identical to the manufacturing the sixth embodiment, illustrated in FIGS. 13F to 13H.

As shown in FIGS. 14D and 14I, an insulating film 52 is deposited, and conductive films 53 (made of, for example, doped polycrystalline silicon) is deposited. The conductive films 53 are subjected to RIE, forming side walls. Then, the insulating film 52 is etched by means of RIE, forming side walls and exposing the substrate 11. Further, a conductive film 36 is deposited. Thereafter, as shown in FIGS. 14E and 14J, the conductive film 36 is etched back, filling the contact holes, in the same manner as in the sixth embodiment and as illustrated in FIGS. 13E and 13J.

In the seventh embodiment, the conductive films 52 completely protect the insulating films 52, and the insulating films 52 are not reduced in thickness at all. This enhances the insulating between the contacts. Moreover, since the conductive films 52 are used as protective films, the buried electrodes do not have their resistance changed even if the contacts have their diameter reduced. This ensures good contact.

Eighth Embodiment

Figure 16A:
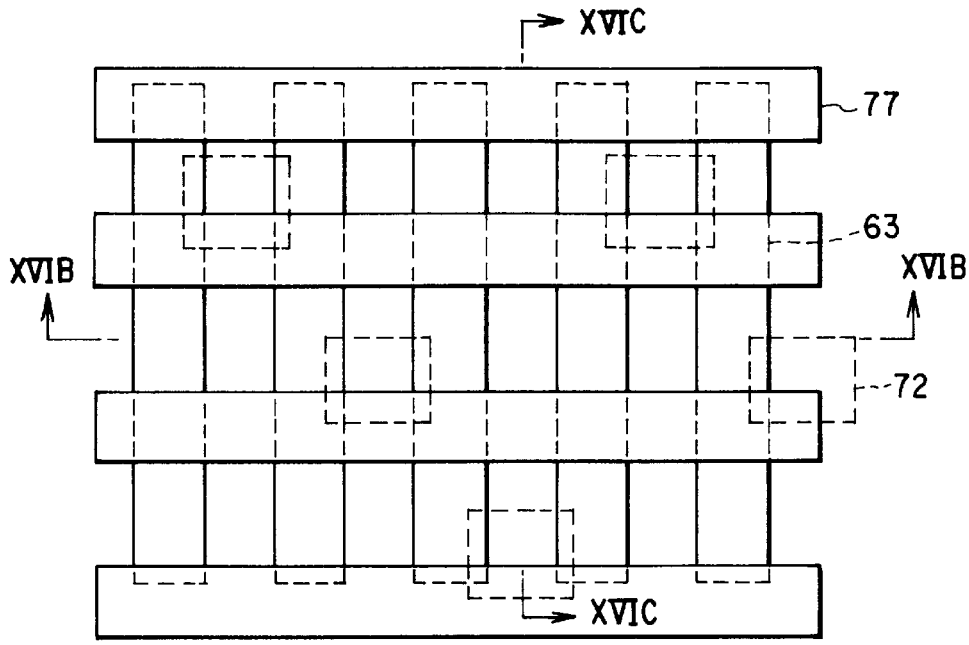
FIGS. 16A to 16C are sectional views explaining the second method of manufacturing the DRAM according to the eighth embodiment.
Figure 16B:
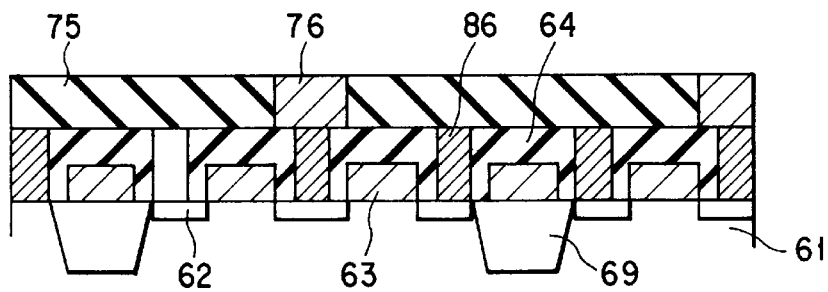
Figure 16C:
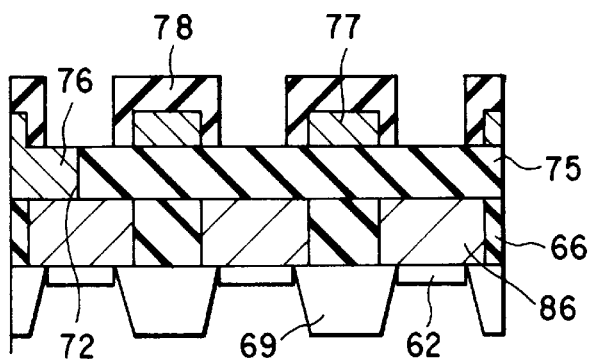
Figure 17A:
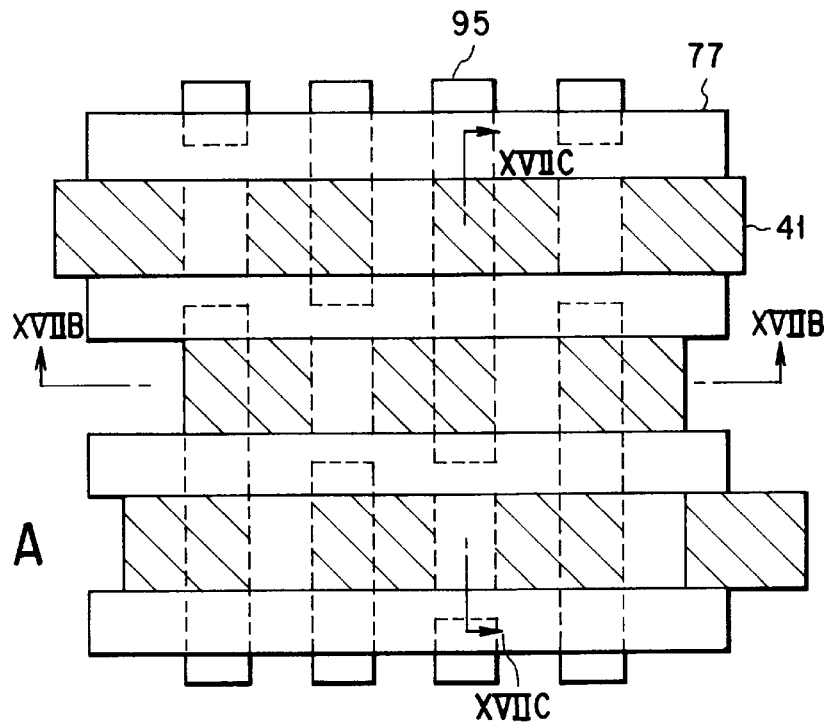
FIGS. 17A to 17C are sectional views explaining the method of manufacturing the DRAM according to the eighth embodiment.
Figure 17B:
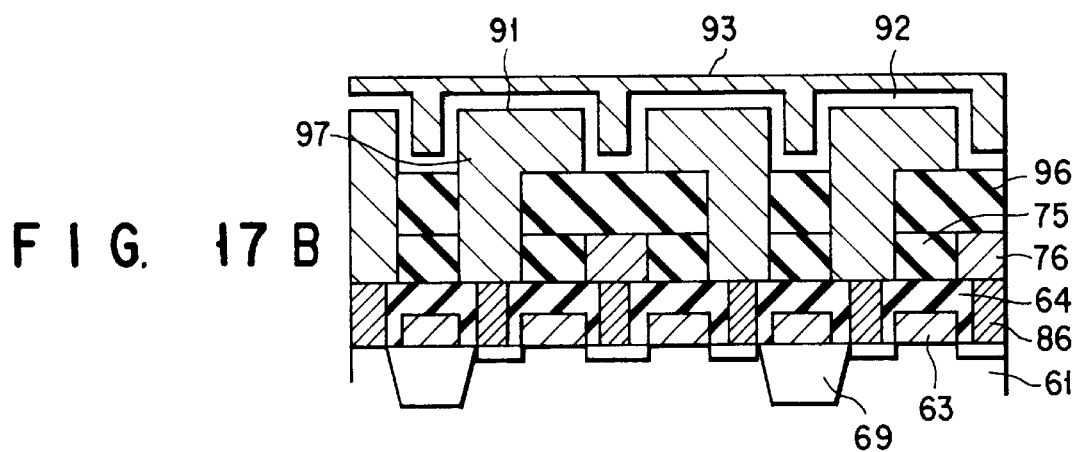
Figure 17C:
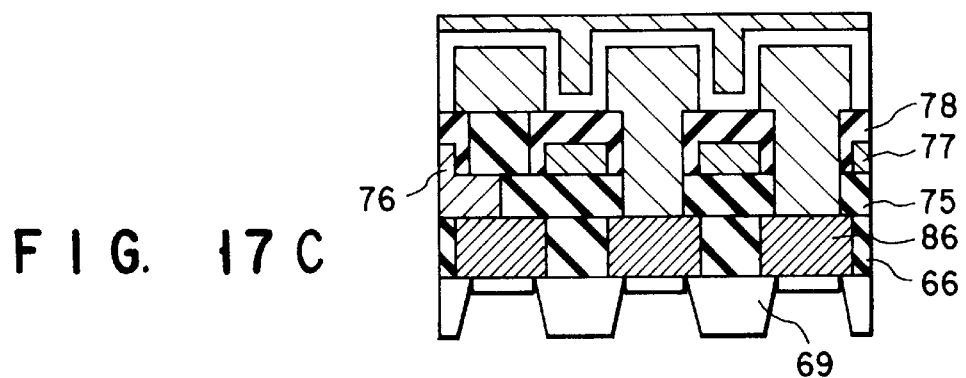

A method of manufacturing the seventh embodiment, which is also a RAM, will be explained with reference to FIGS. 15A to 15C, FIGS. 16A to 16C and FIGS. 17A to 17C. FIGS. 15A, 16A and 17A are plan views, each representing a memory-cell layout. FIGS. 15B and 15C are sectional views, taken along line XVB and line XVC. FIGS. 16B and 16C are sectional views, taken along line XVIB and line XVIC. FIGS. 17B and 17C are sectional views, taken along line XVIIB and line XVIIC.

This RAM comprises stacked memory cells, each having a capacitor provided on a bit line. The present invention is applied to the buried contacts and storage-node contacts of the memory cells of the DRAM.

The DRAM comprises a semiconductor substrate 61, diffusion layers 62, gate electrodes 63, gate-protecting/insulating films 64, inter-layer insulating films 66, 75 and 96, a contact pattern 67, element regions (shaded) 68, element-isolating regions 69, bit-line contacts 72, buried electrodes 76, 86 and 97, bit lines 77, bit-line protecting/insulating films 78, storage electrodes 91, capacitor-insulating films 92, plate electrodes 93, and storage-node (SN) contacts.

A method of manufacturing the DRAM will be explained, with reference to FIGS. 15A to 15C, FIGS. 16A to 16C and FIGS. 17A to 17C.

As shown in FIGS. 15A, 15B and 15C, slits are made in the insulating film 66 provided among the gate electrodes 63, by using the contact pattern 67. Contact holes are formed by using a gate pattern and arranged along the slits made in the insulating film 66. The contact holes are filled with polycrystalline silicon, forming buried electrodes 86.

Next, as shown in FIGS. 16A, 16B and 16C, an inter-layer insulating film 75 is deposited. Holes are made in the film 75, exposing the buried electrodes 86. Buried electrodes 76 are formed in these holes. Bit lines 77 are formed, which extend at right angles to the gate electrodes 63. Like the gate electrodes 63, the bit lines 77 are covered with insulating films 78.

Then, as shown in FIGS. 17A, 17B and 17C, insulating films 96 are formed among the bit lines 77. Using a storage-node contact pattern 95 consisting of strips each crossing two bit lines 77, contact holes are made, each reaching one buried electrode located between two adjacent gate electrodes 63. At this time, each slit of the pattern 95 is divided by the bit lines 77. The contact holes are filled with conductive material, which form buried electrodes 97. Then, storage electrodes 91 are formed which contact the buried electrodes 86. Thereafter, capacitor-insulating films 92 are deposited and plate electrodes 93 are formed, whereby memory cells are made.

Ninth Embodiment

Figure 18:
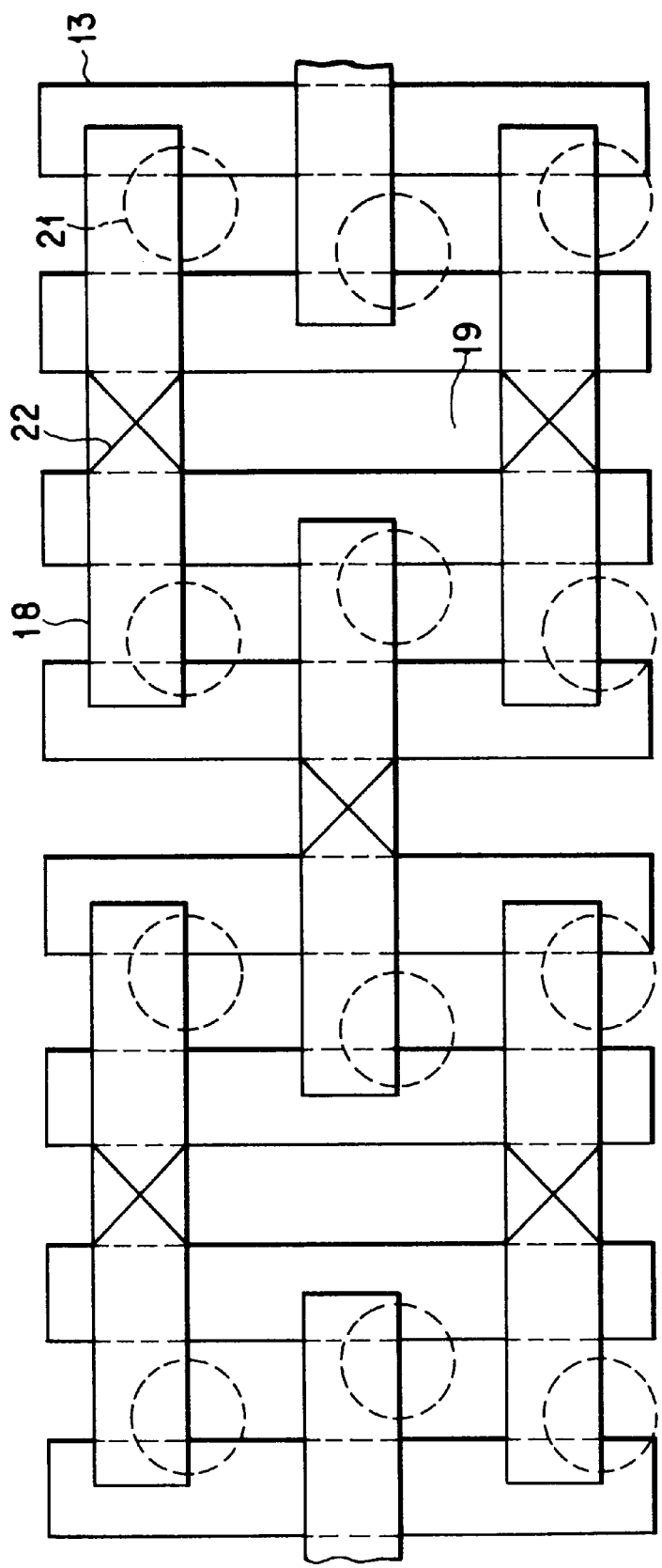
FIG. 18 is a plan view representing the layout pattern of a DRAM according to a ninth embodiment of the present invention.

FIG. 18 is a plan view representing the layout pattern of a DRAM according to a ninth embodiment of the present invention.

The ninth embodiment shows the case in which the present invention is applied to the $8F^2$ trench-type memory cells. The second embodiment (FIG. 7) has adopted the $6F^2$ trench-type memory cells, whereas the ninth embodiment adopts $8F^2$ trench-type memory cells, whose layout pattern is shown in FIG. 18. That is, each of the element regions 18 is formed to intersect with two gate electrodes 13 and is mounted above four gate electrodes 13. In this case, one bit-line contact is provided at a position corresponding to the center of each of the element regions 18, and two SN contacts are provided at both sides thereof.

Also in case of the $8F^2$ trench-type memory cells, the contact hole provided in it is divided into two parts for a bit-line contact portion and a storage-node contact portion, respectively. The contact holes would not be formed at unnecessary portions.

Accordingly, in the case where the present invention is applied to the $8F^2$ trench-type memory cells, an equivalent advantage obtained in the $6F^2$ trench-type memory cells can be obtained.

Tenth Embodiment

Figure 19A:
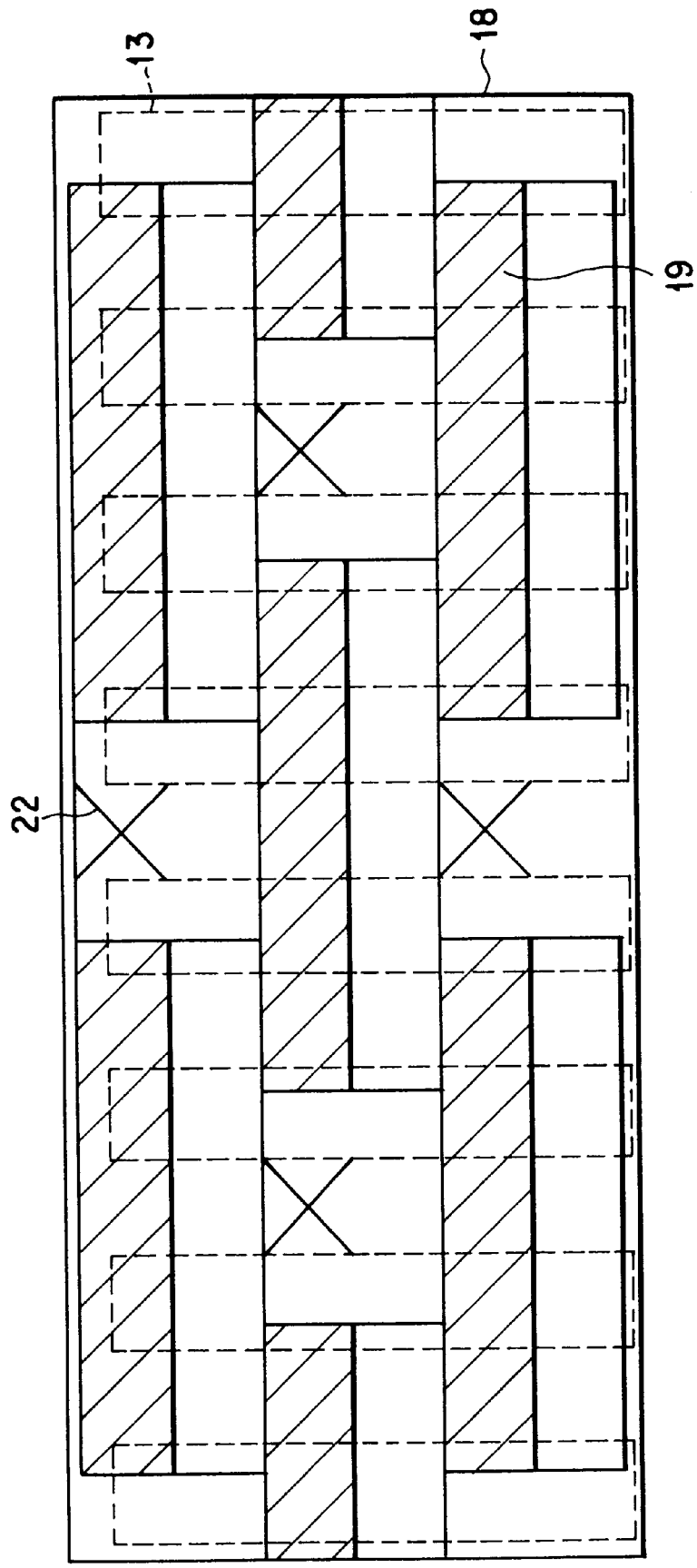
FIGS. 19A and 19B are plan views representing the layout pattern of a DRAM according to a tenth embodiment of the present invention.
Figure 19B:
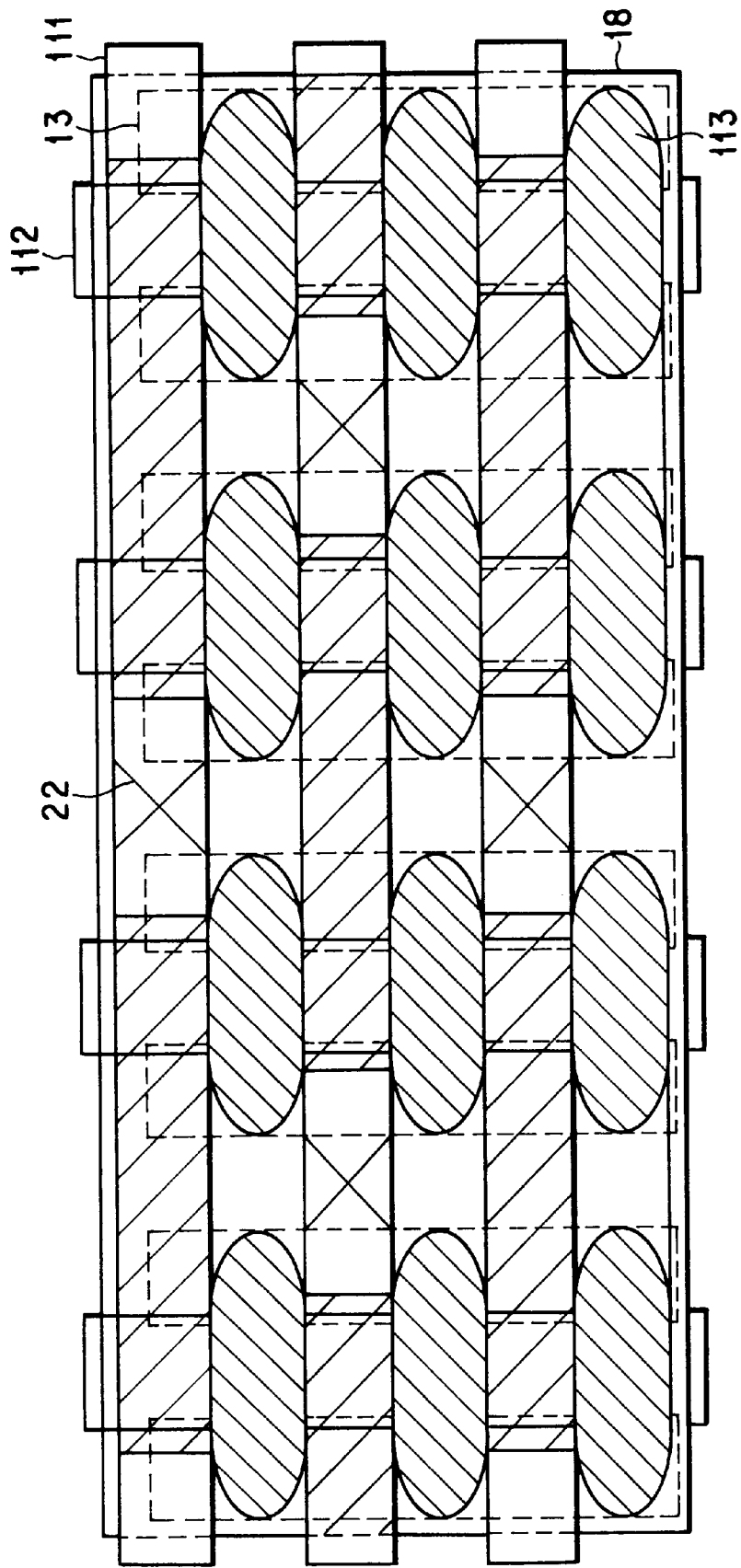

FIGS. 19A and 19B are plan views representing the layout pattern of a DRAM according to a tenth embodiment of the present invention.

The tenth embodiment shows the case in which the present invention is applied to the $8F^2$ stack-type memory cells. The third embodiment (FIG. 9) has adopted the $6F^2$ stack-type memory cells, whereas the tenth embodiment adopts $8F^2$ stack-type memory cells, whose layout pattern is shown in FIG. 19B.

A lastly formed layout pattern is shown in FIG. 19B; however a simplified layout pattern is shown in FIG. 19A in which several parts (e.g., storage electrodes and the like) are omitted for improved understanding. The shaded regions 19 in FIG. 19A indicate the regions covered with resist. On the other hand, element regions are formed in other regions. As shown in FIG. 19B, each of the storage electrodes 113 and contacts 112 for these electrodes is provided to bridge between two gate electrodes 13.

In other words, gate electrodes as a plurality of wires are arranged in parallel, the convex portion of the slit pattern intersects with the gate electrodes in a similar case of the pattern forming the element regions, and is formed displaced by half a pitch in a similar case of the arrangement of the element region. Further, bit-line contacts 22 are selectively formed on the predetermined regions.

Accordingly, in the case where the present invention is applied to the $8F^2$ stack-type memory cells, an equivalent advantage obtained in the $6F^2$ stack-type memory cells can be obtained. Further, in the $8F^2$ stack-type memory cells, there is no need to adopt a complicated pattern for forming the electrodes, so that the bit lines and the element regions can be easily displaced.

As has been described above, the present invention can provide a semiconductor device in which no contact failure occurs even if contact holes are displaced with respect to wires extending parallel. Hence, it is possible with the present invention to manufacture a next generation 1 G-bit DRAM with high yield.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

In each embodiment described above, the present invention is applied to the gate electrodes. Nevertheless, the present invention can be applied to electrodes other than gate electrodes. Furthermore, although the embodiments described are DRAMs, the present invention can be applied to semiconductor memories other than DRAMs. Still further, the present invention is not limited to semiconductor memories; it can be applied to any other semiconductor device which has contact holes made among wires (e.g., gate wires or the like arranged on the peripheral circuitry region) extending parallel to one another.

What is claimed is:

1. A method of manufacturing a semiconductor device, comprising the steps of:

arranging a plurality of wires, on a semiconductor substrate;

forming insulating films of a first group on tops of said wires, respectively;

forming insulating films of a second group on sides of said wires, respectively;

forming, among said wires, insulating films of a third group which have upper surfaces located at a level not higher than upper surfaces of said insulating films of the first group;

forming contact-forming masks having patterns which intersect with at least one of said wires;

forming contact holes by subjecting said insulating films of the third group to selectively etching; and filling said contact holes with electrically conductive material.

2. The method according to claim 1, wherein said step of forming the contract holes includes a step of etching the insulating films of said third group by using the contact-forming mask having patterns and by using said insulating film of the first group as a stopper.

3. The method according to claim 1, wherein said step of forming the contact holes includes a step of etching the insulating films of said third group by using the contact-forming masks having patterns and by using said insulating films of the first and second groups as a stopper.

4. The method according to claim 1, further comprising the step of a forming insulating films of fourth group on sides of said contact holes after the step of forming the contact holes.

5. The method according to claim 1, further comprising the step of forming two-layer films on sides of said contact holes after the step of forming the contact holes, each of said two-layer films including an insulating film and a conductive film.

6. The method according to claim 1, wherein, in the step of filling said contact holes with electrically conductive material, said electrically conductive material forms contacts which have upper surfaces located at a level equal to or lower than upper surfaces of remaining parts of said insulating films of the third group.

7. The method according to claim 1, wherein said plurality of wires are arranged in parallel to one another.

8. A method of manufacturing a semiconductor device, comprising the steps of:

arranging a plurality of wires in parallel to one another, on a semiconductor substrate;

forming insulating films of a first group on tops of said wires, respectively;

forming insulating films of a second group on sides of said wires, respectively;

forming insulating films of a third group among said wires;

forming contact-forming masks having patterns which intersect with at least one of said wires;

forming contact holes by subjecting said insulating films of the third group to selectively etching; and filling said contact holes with electrically conductive material, thereby forming contacts which have upper surfaces located at a level not higher than upper surfaces of remaining parts of said insulating films of the first group.

9. The method according to claim 8, wherein said step of forming the contract holes includes a step of etching the insulating films of said third group by using the contact-forming masks having patterns and by using said insulating film of the first group as a stopper.

10. The method according to claim 8, wherein said step of forming the contract holes includes a step of etching the insulating films of said third group by using the contact-forming masks having patterns and by using said insulating films of the,first and second groups as a stopper.

11. The method according to claim 8, further comprising the step of a forming insulating films of fourth group on sides of said contact holes after the step of forming the contact holes.

12. The method according to claim 8, further comprising the step of forming two-layer films on sides of said contact holes after the step of forming the contact holes, each of said two-layer films consisting of an insulating film and a conductive film.

13. The method according to claim 8, wherein, in the step of forming said insulating films of the third group, said insulating fits,of the third group have upper surfaces located at a level equal to or higher than upper surfaces of said insulating films of the first group.

14. The method according to claim 8, wherein said plurality of wires are arranged in parallel to one another.

15. The method according to claim 1, further comprising:

forming said patterns as slits extending substantially perpendicular to said wires and each slit intersecting with a plurality of said wires.

16. The method according to claim 15, further comprising:

forming said slits extending parallel to each other.

* * * * *